(12) United States Patent
Azatchi et al.

(10) Patent No.: US 7,389,215 B2
(45) Date of Patent: Jun. 17, 2008

(54) EFFICIENT PRESENTATION OF FUNCTIONAL COVERAGE RESULTS

(75) Inventors: Yehezkel Azatchi, Kiryat Motzkin (IL); Eitan Marcus, Haifa (IL); Shmuel Ur, D. N. Misgav (IL); Avi Ziv, Haifa (IL); Keren Zohar, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 11/101,333

(22) Filed: Apr. 7, 2005

(65) Prior Publication Data
US 2006/0229860 A1   Oct. 12, 2006

(51) Int. Cl.
*G06F 17/50* (2006.01)

(52) U.S. Cl. .............................. 703/14; 703/13; 703/23; 716/4; 716/5; 717/125; 714/742; 714/741; 714/724

(58) Field of Classification Search ............... 703/14, 703/13, 23; 716/4, 5; 717/125; 714/742, 714/741; 706/45; 257/678
See application file for complete search history.

(56) References Cited

U.S. PATENT DOCUMENTS

| | | | | |
|---|---|---|---|---|
| 5,539,652 | A * | 7/1996 | Tegethoff | 703/14 |
| 6,536,036 | B1 * | 3/2003 | Pavela | 717/125 |
| 6,584,455 | B1 * | 6/2003 | Hekmatpour | 706/45 |
| 6,675,138 | B1 * | 1/2004 | Hollander et al. | 703/13 |
| 2001/0010091 | A1 * | 7/2001 | Noy | 716/4 |
| 2002/0002698 | A1 * | 1/2002 | Hekmatpour | 716/4 |
| 2003/0093716 | A1 * | 5/2003 | Farchi et al. | 714/34 |
| 2003/0225565 | A1 * | 12/2003 | Garcia et al. | 703/23 |
| 2003/0229864 | A1 * | 12/2003 | Watkins | 716/4 |
| 2004/0216023 | A1 * | 10/2004 | Maoz et al. | 714/742 |
| 2004/0230928 | A1 * | 11/2004 | Nozuyama | 716/5 |
| 2004/0261043 | A1 * | 12/2004 | Baumgartner et al. | 716/4 |
| 2005/0023656 | A1 * | 2/2005 | Leedy | 257/678 |
| 2005/0102596 | A1 * | 5/2005 | Hekmatpour | 714/741 |
| 2005/0149805 | A1 * | 7/2005 | Syed et al. | 714/741 |
| 2006/0069969 | A1 * | 3/2006 | Ohnewald et al. | 714/724 |

OTHER PUBLICATIONS

Long et al., "FILL and FUNI: Algorithms to identify illegel states and sequentially untestable faults", ACM, 2000.*
Cheng, K., "Gate-level test generation for sequential circuits", ACM, 1996.*
Hua et al., "Design of systems with concurrent error detection using software redundancy", IEEE, 1986.*
Zambotti et al., "LSI-CP: VLSI microprocessor emulates military processors", ACM, 1984.*

(Continued)

*Primary Examiner*—Paul L Rodriguez
*Assistant Examiner*—Kandasamy Thangavelu

(57) ABSTRACT

A method for presentation of functional coverage includes representing a set of attributes of a design under test as a multi-dimensional cross-product space, which includes events corresponding to combinations of values of the attributes to be tested, the events including legal and illegal events. At least one test is run on the design, and responsively to the at least one test, a first group of the legal events that were covered by the at least one test and a second group of the legal events that remain non-covered after the at least one test are identified. One or more of the illegal events are grouped with at least one of the first and second groups so as to present a simplified model of the coverage of the events in the cross-product space.

10 Claims, 4 Drawing Sheets

OTHER PUBLICATIONS

Lachish, Oded et al., "Hole Analysis for Functional Coverage Data," 39th Design Automation Conference, DAC 2002, Jun. 10-14, 2002, New Orleans, Louisiana.

Piziali, Andrew, "Functional Verification Coverage Measurement and Analysis", Kluwer Academic Publishers, Boston, 2004. (Introduction, Sections, 1, 2, and 7).

* cited by examiner

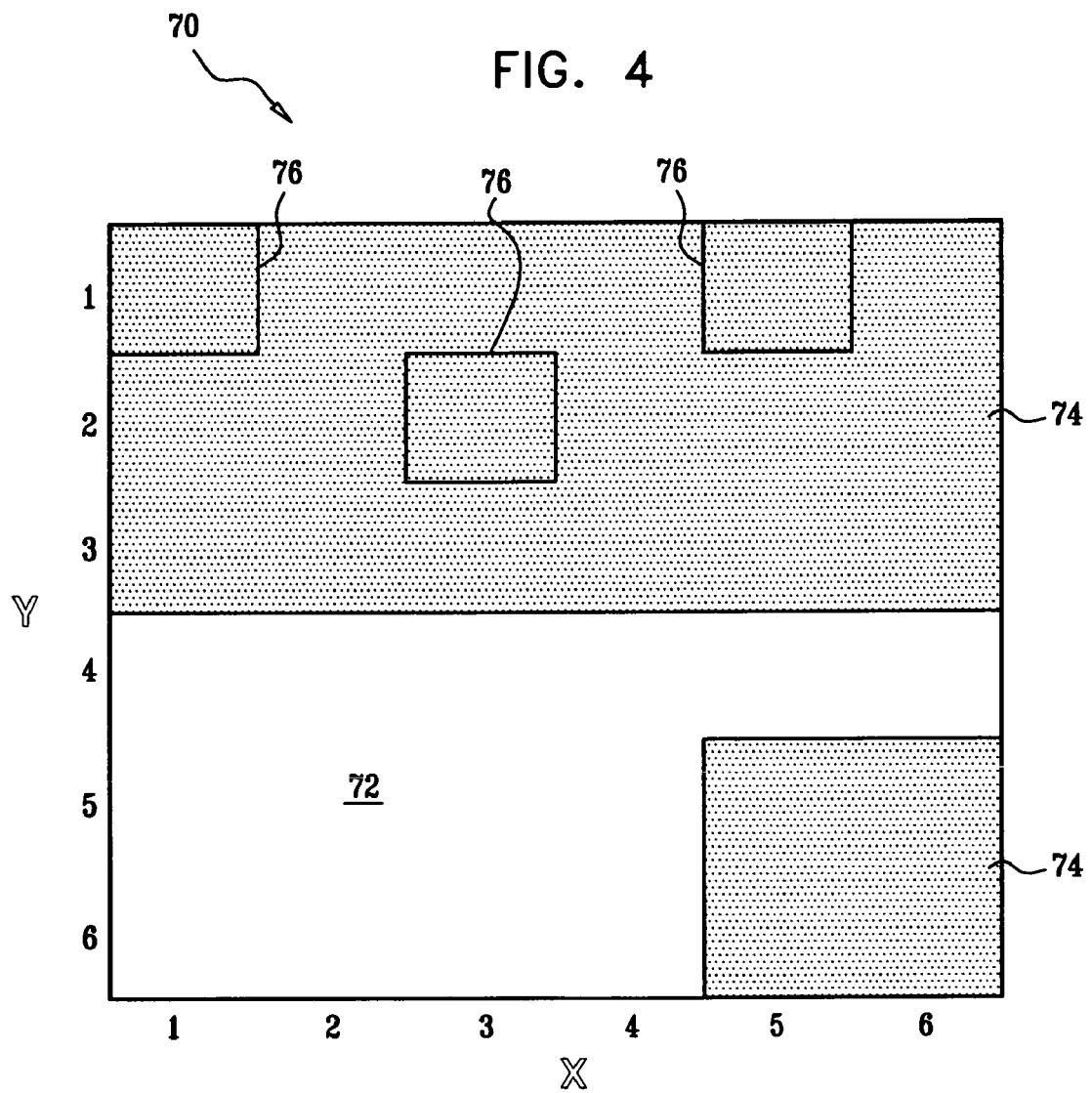

EFFICIENT PRESENTATION OF FUNCTIONAL COVERAGE RESULTS

FIELD OF THE INVENTION

The present invention relates generally to functional verification, and specifically to tools for assessing coverage of functional verification tests.

BACKGROUND OF THE INVENTION

Despite advances in the area of formal verification, simulation-based techniques are still the cornerstone of the functional verification of processors and systems. These techniques involve running test-programs on environments that simulate the actual design. The design is verified by comparing the test-program results from such simulation environments with results expected from the design itself. A major concern in verification by simulation is to assess the coverage of the testing performed up to a given point. For this purpose, test coverage tools attempt to create, in a systematic fashion, a large and comprehensive list of tasks and to check which tasks have been covered in the testing phase.

One of the main goals of coverage tools is to provide the user with an informative presentation of coverage information. Specifically, information on large, cohesive sets of non-covered tasks with common properties is useful in guiding the user to define additional tests to cover these tasks efficiently. One method for this purpose involves discovering and reporting large non-covered spaces (referred to as "holes") in a cross-product model of the test domain. This sort of method is described by Lachish et al., in "Hole Analysis for Functional Coverage Data," 39th Design Automation Conference (DAC 2002, New Orleans, La.), which is incorporated herein by reference. Holes in the coverage space expose gaps in the testing, which the user may then "plug" with additional tests. The authors describe a method for aggregating holes that are quantitatively similar, and specifically holes separated by a Hamming distance of one.

SUMMARY OF THE INVENTION

Embodiments of the present invention provide improved methods and systems for analyzing and presenting coverage results in a cross-product space.

Cross-product models are typically defined by the Cartesian product of several attribute values, wherein each attribute refers to a different aspect of the design under test. The size of the cross-product depends on the number of attributes and the number of different values that each attribute can assume. In complex designs, the cross-product may contain millions or even billions of different combinations of attribute values (wherein each such combination is referred to as an "event"). Not all combinations are legal, however, in the sense that many combinations of attribute values cannot occur in actual operation of the design and thus need not be tested. In other words, the size of the model (in terms of the legal events that it contains) in actuality can be much smaller than the complete Cartesian cross-product of the model attributes.

Some embodiments of the present invention use this aspect of functional coverage to simplify the presentation and analysis of coverage holes. In these embodiments, illegal events in the cross-product space are aggregated with covered or non-covered areas of the space in order to simplify the coverage presentation. In one embodiment, the illegal events are aggregated with the covered part of the space (i.e., no distinction is made in the presentation between covered events and at least some of the illegal events), so that non-covered legal events are presented more clearly to the user. Alternatively or additionally, when illegal events are sparsely distributed within non-covered areas of the cross-product space, these events may be aggregated with the non-covered areas to present large holes of more regular shape. These approaches enable the user to more easily visualize and generalize the existing gaps in coverage, and thus to add tests that cover the gaps more effectively.

In other embodiments of the present invention, the coverage presentation is simplified by aggregating sparsely-distributed covered events into surrounding holes in the coverage model. As in the preceding embodiments, this aggregation can be useful in visualizing test progress and guiding the user to define effective additional tests, even if it may lead to a certain amount of re-testing of attribute combinations that have already been tested.

Although the embodiments described herein relate primarily to the presentation of coverage holes, the principles of the present invention are likewise applicable, mutatis mutandis, to the dual problem of displaying coverage blocks, i.e., large covered spaces in the coverage model.

There is therefore provided, in accordance with an embodiment of the invention, a method for presentation of functional coverage, including:

representing a set of attributes of a design under test as a multi-dimensional cross-product space, including events corresponding to combinations of values of the attributes to be tested, the events including legal and illegal events;

running at least one test on the design;

identifying, responsively to the at least one test, a first group of the legal events that were covered by the at least one test and a second group of the legal events that remain non-covered after the at least one test; and grouping one or more of the illegal events with at least one of the first and second groups so as to present a simplified model of the coverage of the events in the cross-product space.

In a disclosed embodiment, identifying the first group includes analyzing a trace of the at least one test in order to identify the events that were covered by the at least one test.

Typically, grouping the one or more of the illegal events includes presenting at least one of a coverage hole and a coverage block in the cross-product space. In one embodiment, grouping the one or more of the illegal events includes grouping at least one of the illegal events into the first group, and aggregating the events in the second group after grouping the at least one of the illegal events into the first group in order to present at least one of the coverage hole and the coverage block.

In other embodiments, grouping the one or more of the illegal events includes grouping at least one of the illegal events into the second group, and aggregating the events in the second group after grouping the at least one of the illegal events into the second group in order to present at least one of the coverage hole and the coverage block, whereby the coverage hole contains one or more of the illegal events. In a disclosed embodiment, aggregating the events in the second group includes determining how to present the coverage hole responsively to a distribution of the illegal events in the coverage holes. Determining how to present the coverage hole may include determining a density of the illegal events in one or more coverage holes, and selecting for presentation at least one of the coverage holes for which the density of the illegal events is less than a predetermined percentage.

There is also provided, in accordance with an embodiment of the invention, a method for presentation of functional coverage, including:

representing a set of attributes of a design under test as a multi-dimensional cross-product space, including events corresponding to combinations of values of the attributes to be tested;

running at least one test on the design;

identifying, responsively to the at least one test, a first group of the events that were covered by the at least one test and a second group of the events that remain non-covered after the at least one test; and grouping one or more of the covered events with the second group so as to present a simplified model of the coverage of the events in the cross-product space.

Typically, grouping the one or more of the covered events includes aggregating the events in the second group in order to present one or more coverage holes.

There is additionally provided, in accordance with an embodiment of the invention, apparatus for presentation of functional coverage, including:

a coverage processor, which is arranged to represent a set of attributes of a design under test as a multi-dimensional cross-product space, including events corresponding to combinations of values of the attributes to be tested, the events including legal and illegal events, and which is further arranged to identify, responsively to running at least one test on the design, a first group of the legal events that were covered by the at least one test and a second group of the legal events that remain non-covered after the at least one test, and to group one or more of the illegal events with at least one of the first and second groups so as to generate a simplified model of the coverage of the events in the cross-product space; and an output device, which is coupled to the coverage processor so as to present the simplified model to a user.

There is further provided, in accordance with an embodiment of the invention, a computer software product for presentation of functional coverage, the product including a computer-readable medium in which program instructions are stored, which instructions, when executed by a computer, cause the computer to represent a set of attributes of a design under test as a multi-dimensional cross-product space, including events corresponding to combinations of values of the attributes to be tested, the events including legal and illegal events, and further cause the computer to identify, responsively to running at least one test on the design, a first group of the legal events that were covered by the at least one test and a second group of the legal events that remain non-covered after the at least one test, and to group one or more of the illegal events with at least one of the first and second groups so as to present a simplified model of the coverage of the events in the cross-product space.

The present invention will be more fully understood from the following detailed description of the embodiments thereof, taken together with the drawings in which:

BRIEF DESCRIPTION OF THE DRAWINGS

FIG. 4 is a schematic map of the Cartesian cross-product space of FIG. 2, illustrating a method for simplifying presentation of the coverage model, in accordance with another embodiment of the present invention.

DETAILED DESCRIPTION OF EMBODIMENTS

Figure 1:
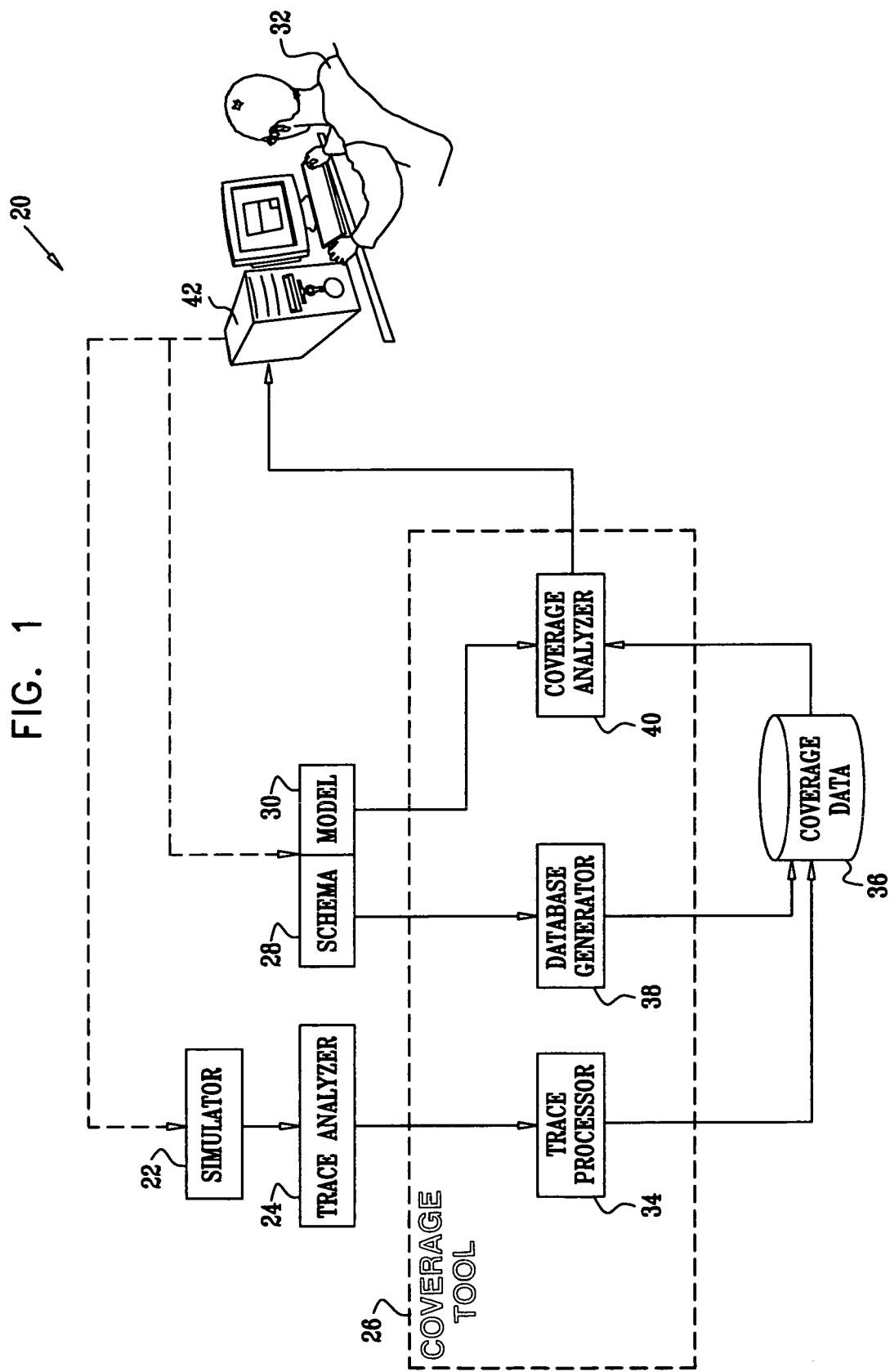
FIG. 1 is a block diagram that schematically illustrates a system for functional coverage analysis, in accordance with an embodiment of the present invention.

FIG. 1 is a block diagram that schematically illustrates a system 20 for functional coverage analysis, in accordance with an embodiment of the present invention. A simulator 22 runs a suite of tests on a design under test, and a trace analyzer 24 generates trace files, containing lists of events that occurred during testing. (An "event" in this context, as explained above, is a particular combination of values of attributes of the design under test, which corresponds to a line in the trace file in the embodiment of FIG. 1.) The trace files are processed by a coverage tool 26 in order to track the coverage of the testing program.

To process and display the coverage results, coverage tool 26 typically uses a schema 28 and a coverage model 30 that are provided by a user 32 of the tool. The schema is a list of attributes that defines the part of the design to be tested, and thus defines the area over which the test coverage is to be measured by tool 26. Each attribute has a bounded set of values, which is referred to as the attribute domain. The model, which is based on the schema, represents the space of events that are of interest in evaluating the test coverage and indicates which events are legal. Since each event is specified by multiple attributes, the cross-product space in which the model is defined is typically multi-dimensional. In order to simplify the presentation of the model, the user may choose projections of the model that allow the model to be more readily visualized in two-, three- or n-dimensional space, wherein n is the number of the attributes in the projection. Additionally or alternatively, the user may select certain subdomains or partitions of the model for analysis and presentation.

In this exemplary embodiment, coverage tool 26 comprises a trace processor 34, which arranges the coverage information from the trace files into a coverage database 36, which is held in a suitable memory. The organization of the database is determined by a database generator 38, on the basis of schema 28. As testing by simulator 22 progresses, trace analyzer 24 and trace processor 34 add data to coverage database 36, indicative of the events that have been covered. A coverage analyzer 40 processes the information in the coverage database and, on the basis of model 30, presents the coverage model on an output device 42, such as a terminal display or a printer. Based on this presentation, user 32 is able to identify holes in the coverage that has been achieved, as well as blocks of events that have been covered, at various points in the course of testing by simulator 22. The user may then specify additional tests to be performed by simulator 22 in order to plug holes that remain in the coverage model. Additionally or alternatively, the coverage model may be applied by an automatic test generator, either autonomously or under the guidance of a user, in generating additional tests.

Typically, coverage tool 26 comprises one or more general-purpose computer processors, which are programmed in software to carry out the functions described herein. The software may be downloaded to the processor in electronic form, over a network, for example, or it may alternatively be supplied on tangible media, such as optical, magnetic or electronic memory media. The different functional elements of the coverage tool may be implemented as different processes running on the same computer, or they may alternatively be divided among different computers. Furthermore, these elements may be integrated with other components of system 20 on a single computer. Alternatively, some or all of these elements may be implemented in dedicated hardware or on a combination of hardware and software components.

The coverage information in database 36 typically identifies three types of events: covered events, non-covered events, and illegal events. As an example, the above-mentioned article by Lachish et al. describes a coverage model of a floating point processor. The elements of the model are shown below in Table I:

TABLE I

ATTRIBUTES OF FLOATING POINT MODEL

| Attribute | Description | Values |
|---|---|---|
| Instr | Opcode of the instruction | fadd, fadds, fsub, fmul, fdiv, fmadd, fmsub, fres, fabs, . . . |
| Result | Type of result | ±0, ±MinDeNorm, ±DeNorm, ±MaxDeNorm, ±MinNorm, ±Norm, . . . |
| Round Mode | Rounding mode | toward nearest, toward 0, toward +∞, toward −∞ |
| Round Occur | Did rounding occur? | True, False |

The coverage model might be expressed semantically as "Test that all instructions produce all possible target results in the various rounding modes supported by the processor both when rounding did and did not occur." Each combination of the attribute values that has been tested then becomes a covered event, while legal combinations that have not been tested are non-covered events. The semantically-expressed functional model, however, also includes illegal events. For example, the result of a "fabs" (absolute value) instruction should in fact, never be negative. Thus, events of the form <Instr=fabs, Result={−}, . . . >are illegal. The embodiments that follow illustrate methods that may be used by coverage analyzer 40 in dealing with illegal events in presentation of the coverage model on output device 42.

Figure 2:
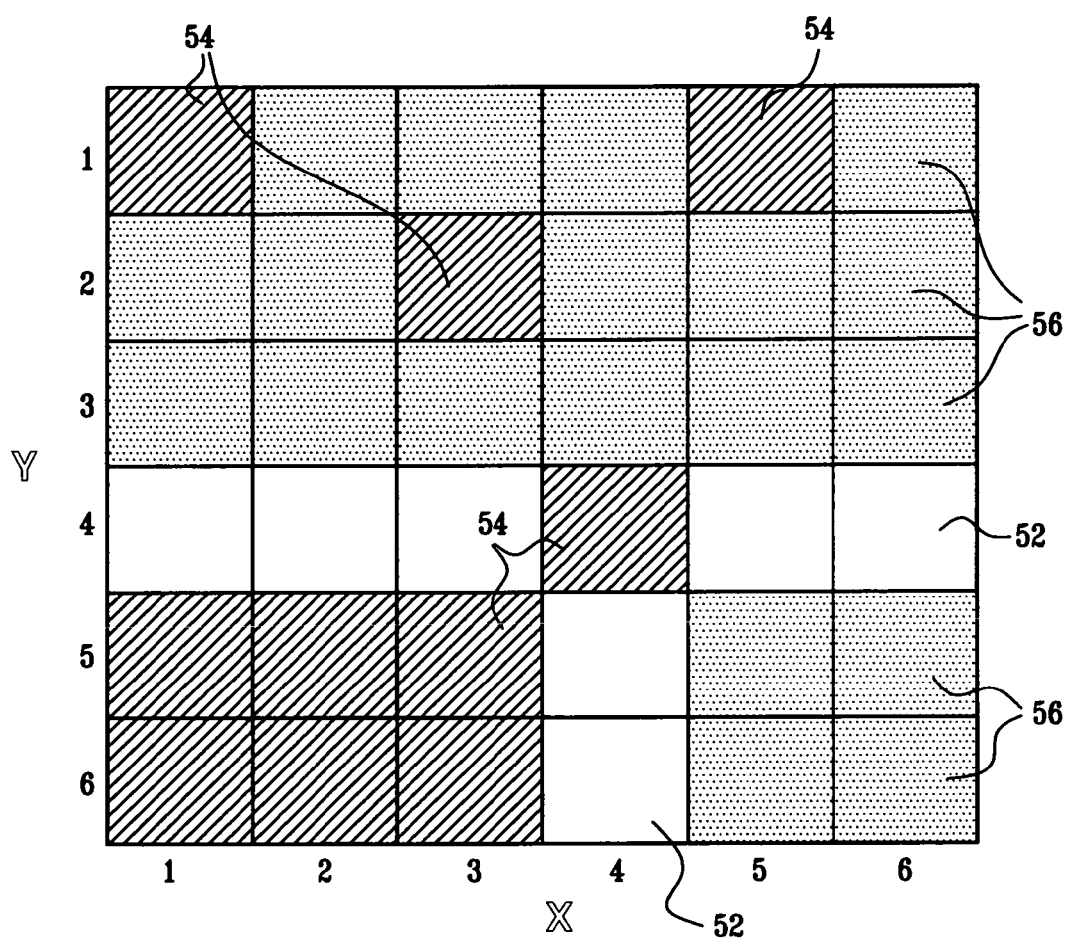
FIG. 2 is a schematic map of a Cartesian cross-product space representing attributes of a coverage model of a design under test, in accordance with an embodiment of the present invention.

FIG. 2 is a simplified map 50 of an exemplary coverage model in a two-dimensional Cartesian cross-product space. The model is based on two attributes, arbitrarily referred to as X (on the horizontal axis) and Y (on the vertical axis), both having integer domains {1, . . . , 6}. Each pair of possible values of the attributes is an event, represented by a corresponding square in the map. The map shows covered events 52 in the model, along with illegal events 54 and non-covered events 56.

Although the embodiments shown in the figures present a coverage model in simple Cartesian space, the principles of the present invention may also be applied to coverage models in other types of multi-dimensional spaces. Examples of such spaces include trees, hybrid coverage spaces, and unions of Cartesian spaces. These and other types of coverage representation are described by Piziali in Functional Verification Coverage and Analysis (Kluwer Academic Publishers, Boston, 2004).

Figure 3:
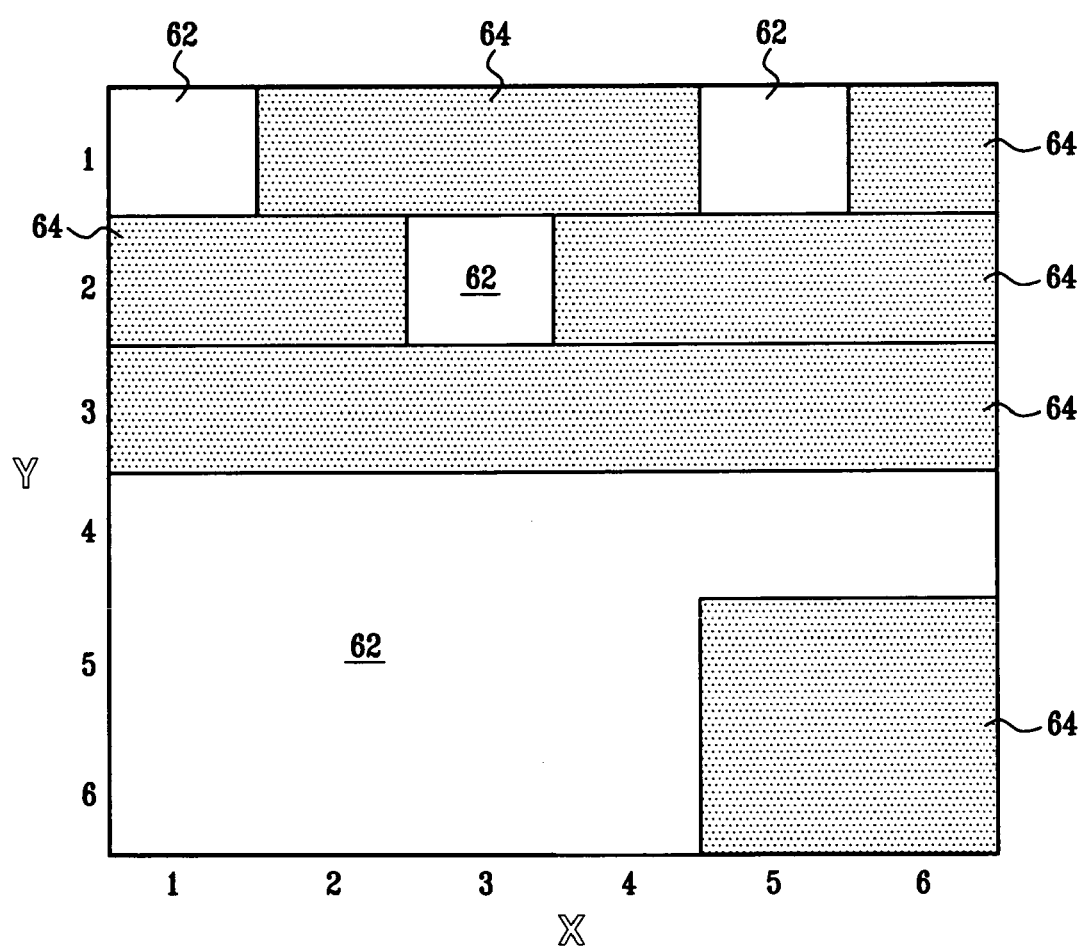
FIG. 3 is a schematic map of the Cartesian cross-product space of FIG. 2, illustrating a method for simplifying presentation of the coverage model, in accordance with an embodiment of the present invention.

FIG. 3 is a schematic map 60 showing a simplified presentation of the coverage model of FIG. 2 that is generated by coverage analyzer 40, in accordance with an embodiment of the present invention. In this embodiment, illegal events 54 are aggregated with covered events 52 into a quasi-covered area 62. The remainder of the map provides a clear presentation of aggregated holes 64, representing the areas of the cross-product space that remain to be covered by further testing. The user can clearly see in map 60, for example, that the attribute value Y=3 has not yet been tested at all. There is no need for user 32 to specify tests that will cover the illegal events in the space, and thus there is no harm in aggregating the illegal events with the covered events.

Formally, if the set of covered events is denoted C, and the set of legal events is denoted L, the method used to generate map 60 may expressed by the pseudocode in Table II below:

TABLE II

PURE HOLE AGGREGATION

1) Raw Data :=~(C ∪~L)
2) holes := Aggregate(Raw Data)
3) Return holes

The tilde (~) indicates negation. The function "Aggregate" collects adjacent events that meet the criterion of "Raw Data," i.e., events that are legal but non-covered, so as to form holes of rectangular shape. Any suitable algorithm may be used for this purpose. In the example shown in FIG. 3, "Aggregate" collects events having the same Y value and adjacent X values in order to form holes that are as long as possible. Then, if two of these holes with adjacent Y values have the same starting and ending X values, the two holes are merged together. The result in the present example is the set of holes <{2, 3, 4},1>, <6, 1>, <{1, 2},2>, <{4, 5, 6},2>, <{1, . . . , 6}, 3>, <{5, 6}, {5, 6}>. Other aggregation algorithms may be used to give holes of other shapes. Algorithms that may be used for this purpose are described, for example, in the above-mentioned article by Lachish et al.

FIG. 4 is a schematic map 70 showing a simplified presentation of the coverage model of FIG. 2 that is generated by coverage analyzer 40, in accordance with another embodiment to the present invention. In this embodiment, illegal events 54 are aggregated with non-covered events 56 with the aim of giving holes that are well generalized, even if a certain number of illegal events are included in the holes as a result. As shown in FIG. 4, this strategy results in the definition of two large holes 74, with a covered space 72 that also includes a number of illegal events. The upper hole <{1, . . . , 6}, {1, 2, 3}> includes three illegal events 76. (Although illegal events 76 are marked in map 70 for the sake of conceptual clarity, the illegal events may be hidden within holes 74 for ease of visualization when coverage models of larger and more complex spaces are presented to the user.) This presentation is advantageous, however, in that it enables user 32 to visualize more readily and intuitively the areas of the cross-product space that remain to be covered and to devise more efficient, generalized test definitions to cover these areas.

The method used to generate map 70 may be expressed in pseudocode form as follows:

TABLE III

GENERALIZED HOLE AGGREGATION

| 1) | Raw Data :=~C ∪~L |
| 2) | holes := Aggregate(Raw Data) |
| 3) | foreach hole in holes |
| 4) |    if hole ∩ L ≠ ∅ |
| 5) |       holes := holes − hole |
| 6) | Return holes |

According to this strategy, holes are constructed by the "Aggregate" function, as described above, over the union of all non-covered and illegal events (equivalent to ~(C∩L)). The holes are then evaluated, and any hole that contains no legal events is discarded from the set of holes. In other words, as long as a hole contains a single legal non-covered event, that hole is presented to the user.

Alternatively, other criteria may be applied in order to determine which illegal events to subsume in the coverage holes that are presented to the user. In particular, the actual distribution of illegal events in each "impure" hole may be used in determining how the hole is presented. ("Impure" in this context refers to a coverage hole that contains one or more events that are not actually legal non-covered events.) For example, step (4) in Table III may specify that only holes containing a relatively low percentage of illegal events are preserved and presented to the user. Additionally or alternatively, it may be required that the illegal events be distributed sparsely within the area of the hole, rather than clustered together.

As another option, a similar strategy may be used to aggregate covered and illegal events (as in the example of FIG. 3 and Table II), so that areas in the cross-product space that contain only illegal events are distinguished from covered areas 62.

Further additionally or alternatively, when illegal events 76 are mixed into holes 74, coverage processor 40 may generate an indication to user 32 of the "purity" of the holes. For example, the coverage processor may compute and display the density of illegal events within each hole. The holes may also be sorted for the user according to criteria such as geometrical size or absolute size (eg., the number of legal, non-covered events that the hole actually contains), purity, or dimension (the number of attribute values that are not covered at all in the hole). Other criteria for aggregating, evaluating and sorting holes or covered areas that include illegal events will be apparent to those skilled in the art and are considered to be within the scope of the present invention.

In an alternative embodiment of the present invention, not shown in the figures, sparsely-distributed covered, legal events are included in holes that are presented to user 32 of system 20. For example, if events 76 in FIG. 4 were legal events that had already been covered by testing in simulator 22, these events might still be included in the presentation of hole 74 in order to give a clearer, more generalized definition of the hole boundaries. Typically, covered events are included in a hole only if they are relatively widely spread and constitute no more than a predetermined percentage of the events in the hole. Furthermore, if a lightly-covered hole (i.e., a hole containing some legal events) contains another large hole that is either a pure hole or has a significantly lower coverage percentage, then this purer hole is typically displayed instead of the larger lightly-covered hole.

Although the embodiments described hereinabove deal primarily with the presentation of coverage holes, the principles of the present invention are also applicable, mutatis mutandis, to the dual problem of aggregating and displaying coverage blocks, i.e., large covered spaces in the coverage model. Visualization of such blocks may similarly be used in determining effective tests to cover the remaining non-covered spaces in the coverage model. Furthermore, although the embodiments described above relate to simulation-based testing of a hardware design, the principles of the present invention may similarly be applied in other areas in which coverage may be an issue, such as software testing or production testing.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for presentation of functional coverage, comprising:
representing a set of attributes of a design under test as a multi-dimensional cross-product space, comprising events corresponding to combinations of values of the attributes to be tested, the events comprising legal and illegal events;
running at least one test on the design;
identifying, responsively to the at least one test, a first group of the legal events that were covered by the at least one test and a second group of the legal events that remain non-covered after the at least one test; and
grouping one or more of the illegal events with at least one of the first and second groups so as to generate a simplified model of the functional coverage of the events in the cross-product space; and
presenting the simplified model of the functional coverage on an output device.

2. The method according to claim 1, wherein identifying the first group comprises analyzing a trace of the at least one test in order to identify the events that were covered by the at least one test.

3. The method according to claim 1, wherein grouping the one or more of the illegal events comprises presenting at least one of a coverage hole and a coverage block in the cross-product space.

4. The method according to claim 3, wherein grouping the one or more of the illegal events comprises grouping at least one of the illegal events into the first group, and aggregating the events in the second group after grouping the at least one of the illegal events into the first group in order to present at least one of the coverage hole and the coverage block.

5. The method according to claim 3, wherein grouping the one or more of the illegal events comprises grouping at least one of the illegal events into the second group, and aggregating the events in the second group after grouping the at least one of the illegal events into the second group in order to present at least one of the coverage hole and the coverage block, whereby the coverage hole contains one or more of the illegal events.

6. The method according to claim 5, wherein aggregating the events in the second group comprises determining how to present the coverage hole responsively to a distribution of the illegal events in the coverage holes.

7. The method according to claim 6, wherein determining how to present the coverage hole comprises determining a density of the illegal events in one or more coverage holes, and selecting for presentation at least one of the coverage holes for which the density of the illegal events is less than a predetermined percentage.

8. The method according to claim 1, and comprising grouping one or more of the covered events with the second group in presenting the simplified model of the coverage in the cross-product space.

9. A method for presentation of functional coverage, comprising:
representing a set of attributes of a design under test as a multi-dimensional cross-product space, comprising events corresponding to combinations of values of the attributes to be tested;
running at least one test on the design;
identifying, responsively to the at least one test, a first group of the events that were covered by the at least one test and a second group of the events that remain non-covered after the at least one test; and grouping one or more of the covered events with the second group so as to generate a simplified model of the functional coverage of the events in the cross-product space; and presenting the simplified model of the functional coverage on an output device.

10. The method according to claim 9, wherein grouping the one or more of the covered events comprises aggregating the events in the second group in order to present one or more coverage holes.

* * * * *